United States Patent [19]

Ryczek et al.

[11] 4,079,267

[45] Mar. 14, 1978

[54] MODULAR IC ON-DELAY TIMER

[75] Inventors: Lawrence J. Ryczek, Greendale; Donald L. Van Zeeland, Franklin, both of Wis.

[73] Assignee: Cutler-Hammer, Inc., Milwaukee, Wis.

[21] Appl. No.: 694,915

[22] Filed: Jun. 10, 1976

[51] Int. Cl.² .............................................. H01H 7/00
[52] U.S. Cl. .................... 307/141; 307/293
[58] Field of Search ................. 307/141, 141.4, 141.8, 307/293; 361/196, 10; 318/345 H; 315/360

[56] References Cited

U.S. PATENT DOCUMENTS

| 3,562,595 | 2/1971 | Swanson et al. | 361/196 |
|---|---|---|---|
| 3,651,375 | 3/1972 | Ebersohl | 361/10 |
| 3,801,866 | 4/1974 | Schmidgall | 361/196 |
| 3,814,948 | 6/1974 | Schuchmann et al. | 307/141 |
| 3,838,748 | 10/1974 | Gray et al. | 361/196 |

*Primary Examiner*—B. Dobeck
*Assistant Examiner*—Eugene S. Indyk
*Attorney, Agent, or Firm*—Hugh R. Rather; William A. Autio; Michael E. Taken

[57] ABSTRACT

An on-delay timer of the solid state type incorporating integrated circuit (IC) modules including a five-transistor array in a dual-in-line package (DIP), a multiple-transistor monolithic triggering comparator circuit used as a timer, and a bidirectional thyristor or Triac. All voltages are referenced to one power line to afford simplicity of circuitry wherein the load current does not flow through the pilot switch. A leaky switch detector circuit using a simple voltage divider is incorporated in the pilot switch circuit.

15 Claims, 9 Drawing Figures

MODULAR IC ON-DELAY TIMER

BACKGROUND OF THE INVENTION

Solid state on-delay timers have been known heretofore. For example, R. P. Schuchmann et al U.S. Pat. No. 3,814,948, dated June 4, 1974, assigned to the assignee of this invention, shows a universal on-delay timer employing discrete solid state elements individually mounted and connected in the circuit. While these prior on-delay timers have been useful for their intended purposes, this invention relates to improvements thereover.

SUMMARY OF THE INVENTION

An object of the invention is to provide an improved on-delay timer.

A more specific object of the invention is to provide an on-delay timer of improved modular solid state construction.

Another specific object of the invention is to provide an on-delay timer employing integrated circuits (IC's) that is simple and economical in construction and efficient in operation.

Another specific object of the invention is to provide an improved on-delay timer wherein simplicity is attained by referencing all voltages to one power conductor.

Another specific object of the invention is to provide the aforementioned timer with a leaky switch detection circuit of simple and economical construction.

Another specific object of the invention is to provide the aforementioned on-delay timer with thyristor output control means and improved clipper-filter means to prevent transient turn-on of the thyristor.

Another specific object of the invention is to provide the aforementioned on-delay timer with a thyristor for controlling a load and a pilot switch for controlling a solid state timer circuit which controls the thyristor wherein the pilot switch does not directly interrupt the load circuit.

Another specific object of the invention is to provide a solid state on-delay timer with solid state switching means for initiating operation thereof and supply voltage regulating means therefor comprising a dual-purpose resistor, which resistor serves not only the voltage regulating means but also controls the solid state switching means to initiate operation of the timer.

Other objects and advantages of the invention will hereinafter appear.

DESCRIPTION OF THE PREFERRED EMBODIMENT

Figure 1:
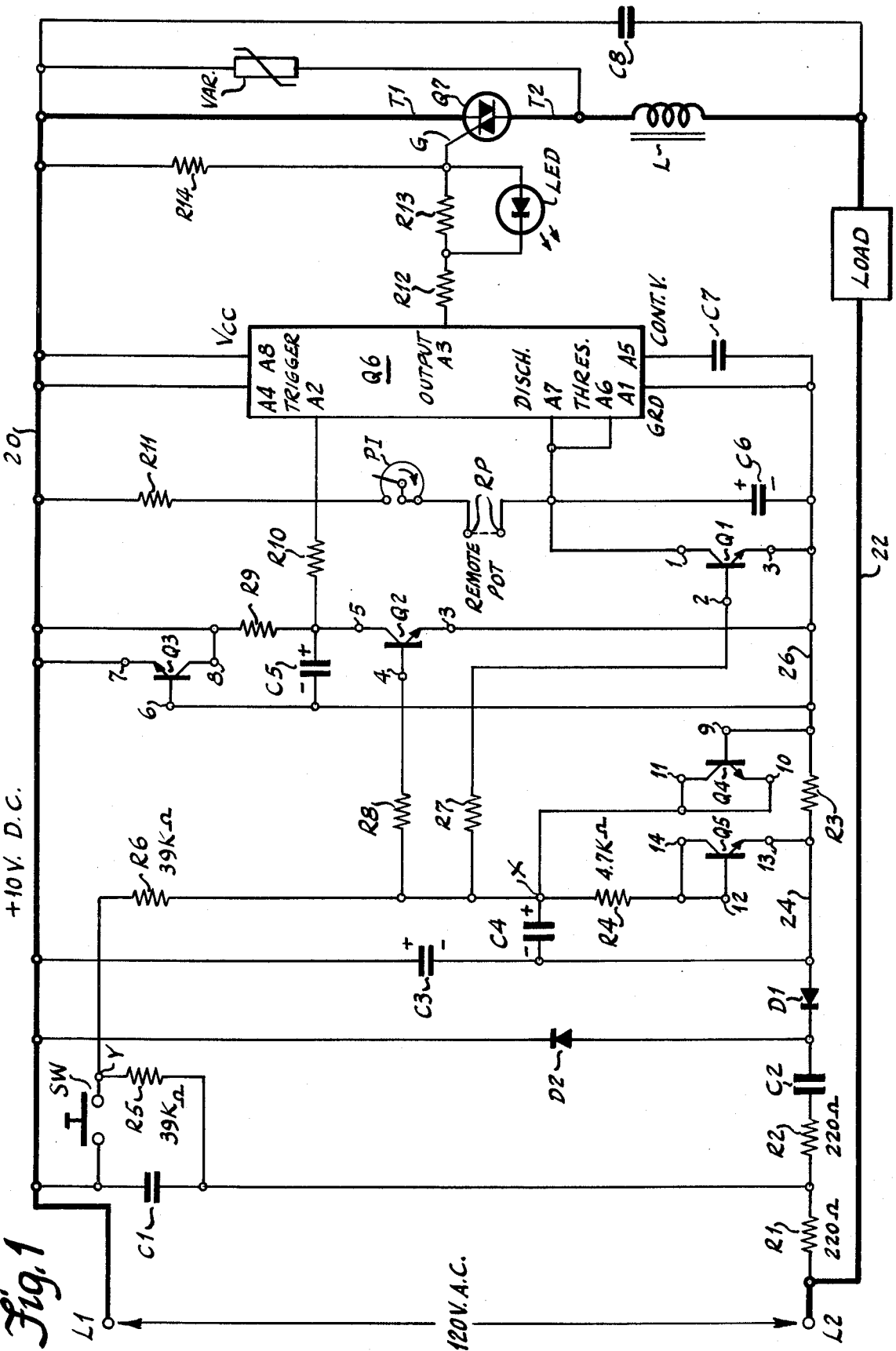
FIG. 1 is a schematic circuit diagram of a modular IC on-delay timer system constructed in accordance with the invention.

Referring to FIG. 1, there is shown a modular integrated circuit on-delay timer system according to the invention. This timer is a delay-on-energization or on-delay timer in that it interposes a predetermined, adjustable time delay after closure of pilot switch SW before the load is energized.

This system is supplied with A.C. electrical power of 120 volts of the like through a pair of power lines L1 and L2 shown at the left side of FIG. 1. The power circuit for the load extends from line L1 through common conductor 20, thyristor Q7, inductor L, the load and conductor 22 to line L2. As hereinafter described in more detail, when the pilot switch is closed, an interval is timed and then thyristor Q7, which is a Triac or like, is gated into conduction to energize the load. When the pilot switch is subsequently re-opened, gating of the Triac is stopped immediately so that it stops conducting at the end of the half-cycle of alternating current power when the current goes to zero value.

The system is provided with a rectifying D.C power supply and regulating circuit fed from the A.C. power lines for supplying low voltage D.C., such as 10 volts or the like, to the timer circuit and its control circuits. The rectifying path extends from line L1 through smoothing capacitor C3, rectifying diode D1, voltage dropping capacitor C2, and T-filter resistors R2 and R1 to line L2. A shunt path for A.C. of opposite polarity extends from line L2 through resistors R1 and R2, capacitor C2, and unidirectional conducting diode D2 to line L1, this path being in shunt of capacitor C3 and diode D1. Therefore, halfwave rectified voltage charges capacitor C3 to the polarity shown in FIG. 1. To complete the T-filter, a capacitor C1 is connected from the junction between resistors R1 and R2 to line L1.

This rectifying circuit functions as follows. On each positive half-cycle of 120 volt A.C. supply voltage, current flows in the aforesaid rectifying path. This charges capacitor C3 to provide unregulated direct voltage across conductors 20 and 24, positive on conductor 20 and negative on conductor 24. On each negative half-cycle of the 120 volt A.C. supply voltage, current flows in the aforesaid shunt path to by-pass capacitor C3. On these positive and negative half-cycles, resistors R1 and R2 limit surge currents, capacitor C2 drops the voltage, and diode D1 rectifies the current so that an unregulated voltage of 10 volts D.C. appears across capacitor C3. The T-filter consisting of resistors R1 and R2 the capacitor C1 filters out high-frequency noise which may appear across lines L1 and L2. Thus, resistors R1 and R2 function not only as part of the T-filter but also function to limit the surge current to low-loss, reactance type, voltage dropping device C2.

The voltage, having been reduced and rectified to 10 volts D.C., is next regulated. For this purpose, the voltage on capacitor C3 causes current to flow through transistor Q3 and resistor R3. Transistor Q3 is an N-P-N transistor connected as a Zener diode to provide regulated 7 volts D.C. across conductors 20 and 26 to supply the timing and Triac gating circuits. Resistor R3 functions not only with transistor Q3 to limit the current for voltage regulation purposes but also provides a voltage drop of 3 volts or the like to reverse-bias the base-emitter junctions of transistor Q1 and Q2 to turn these two transistors off at a time hereinafter described to initiate timing action.

TURN-OFF OPERATION

Whenever pilot switch SW is open, as shown in FIG. 1, current flows, on each negative half-cycle of the 120 volt A.C. supply voltage, from line L2 through resistors R1, R5, R6 and R4, transistor Q5 and capacitor C3 to line L1. Capacitor C4 charges, positive on its right side and negative on its left side, for a delay purpose hereinafter described. The voltage drop on resistor R4, due to this current from the 120 volt supply, exceeds and overcomes the reverse (bias) voltage drop on resistor R3, due to 10 volts on capacitor C3 as aforementioned. Therefore, this exceeding voltage drop on resistor R4 causes current to flow in parallel with resistor R4 and transistor Q5 in two branches, namely, in a first branch through resistor R7 and the base-emitter junction of transistor Q1, and in a second branch through resistor R8 and the base-emitter junction of transistor Q2. These currents turn transistors Q1 and Q2 on periodically for the duration of each such negative half-cycle of the supply voltage. Transistor Q4 is connected as a Zener diode across resistor R4 and transistor Q5 to limit the voltage at junction X to about 7 volts. This transistor functions as a forward diode in the other direction to limit the reverse voltage on the base of transistors Q1 and Q2.

Alternately, on each positive half-cycle, the reverse bias provided by the voltage drop on resistor R3 tends to turn transistors Q1 and Q2 off. As a result of these turn-on periods, transistor Q1, being in shunt thereof, prevents timing capacitor C6 from accumulating any significant charge, thus to keep triggering comparator module Q6 turned off.

The intermittent action of transistor Q1 turning on and off at a 60 Hz rate as aforesaid is sufficient to continuously trigger comparator module Q6, via trigger terminal A2, thus holding its output terminal A3 high (off) and holding Triac Q7 off. The terms "high" and "low" in this description refer to relative values of D.C. voltages that control the IC timer circuit, "high" being at or near positive 10 volts and "low" being at or near 3 volts or ground (conductor 26 voltage). This trigger terminal A2 is switched to low as follows. When transistor Q2 is on, low is applied from conductor 26 therethrough and through resistor R10 to trigger terminal A2. This trigger terminal A2 is switched to high as follows. When transistor Q2 is turned off, high is applied from conductor 20 through resistors R9 and R10 to trigger terminal A2.

Capacitor C5, whose primary purpose is to prevent instantaneous energization of the load when power is first connected if pilot switch SW is closed, also assists in stretching the periods that trigger terminal A2 is switched to and held at low. During the negative half-cycle periods that transistor Q2 is on to apply low to trigger terminal A2, capacitor C5 discharges therethrough. During the alternate positive half-cycle periods, capacitor C5, having a capacitance of 1 mf, charges, thus keeping trigger terminal A2 low for at least the beginning portion of this half-cycle. This keeps output terminal A3 high. The comparator module remains in this condition with its output terminal A3 high or off as long as transistor Q2 switches on and off at the 60 rate as aforesaid and until timing action is initiated as hereinafter described.

LINEAR IC TIMER CIRCUIT OPERATION

Comparator module Q6 is connected as shown in FIG. 1. It is supplied with 7 volts D.C. power Vcc across its terminal A8 and ground terminal A1. This comparator module has a number of applications but for on-delay timing operation, it is connected as shown in FIG. 1. For this purpose, its reset terminal A4 is also connected to 7 volts D.C. Its control voltage terminal A5 is connected through a small capacitor C7 to ground conductor 26. Its trigger terminal A2 is connected to resistor R10 and its output terminal A3 is connected through resistors R12 and R13 to the gate of Triac Q7. Its threshold and discharge terminals A6 and A7 are connected together and to the positive side of timing capacitor C6.

Figure 5:
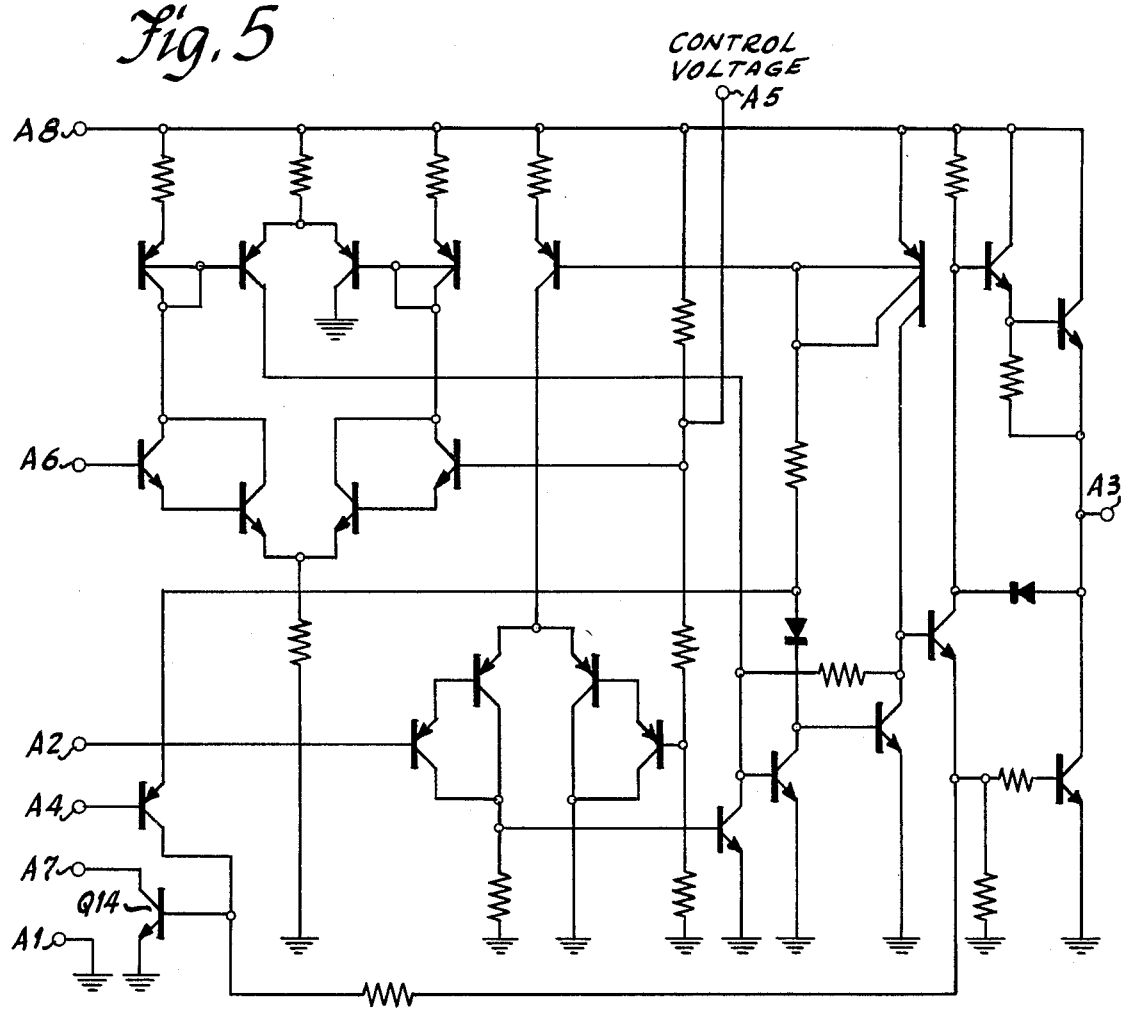
FIG. 5 is a schematic circuit diagram of a linear integrated circuit (IC) triggering comparator module used as a timer in the system of FIG. 1.

For purposes of this invention, this timer circuit operates as follows. When trigger terminal A2 is switched to high, output terminal A3 remains at high until threshold terminal A6 rises to $\frac{2}{3}$ of its terminal A8 voltage Vcc, whereupon output terminal A3 switches to low. At low output the timer is on and at high output the timer is off. Reset terminal A4 is an inhibit at low and, therefore, is held at Vcc voltage (high) to allow operation. Ground terminal A1 is connected to low. Discharge terminal A7 is held at high but goes to low (ground) when output A3 goes low so as to discharge timing capacitor C6 and, thus, reset the timer into readiness for another timing operation. Control voltage terminal A5 is connected through noise suppressor capacitor C7 to low, and as shown in FIG. 5, this control voltage terminal A5 is connected to the $\frac{2}{3}$ voltage point within the timer circuit.

TURN-ON OPERATION

When pilot switch SW is closed, the aforementioned current flow through resistors R6 and R4 and transistor Q5 is reduced because not only 10 volts D.C. is applied to this circuit rather than the 120 A.C. half-cycles previously applied, the 120 volt negative half-cycles being shunted through pilot switch SW to line L1. However, the reduction in current flow in resistor R4 occurs after a time delay interposed by capacitor C4 to prevent contact bounce from causing erratic operation. This delay is brought about by charged capacitor C4 discharging through resistor R4 and transistor Q5 to maintain the voltage level at junction X for such time interval.

After this time delay, when the current in resistor R4 decreases, the voltage drop across resistor R4 decreases, allowing the voltage on resistor R3 to reverse bias transistors Q1 and Q2 off. With transistor Q2 off, trigger terminal A2 of comparator module Q6 goes high but output terminal A3 remains high until the voltage at threshold terminal A6 rises to $\frac{2}{3}$ of voltage Vcc at the end of the timing interval.

With resistor Q1 turned off, timing capacitor C6 starts charging by current flow from conductor 20 through resistor R11, potentiometer P1 and a remote potentiometer, if any, connected to terminals RP. This timing capacitor charges at a rate determined by the setting of potentiometer P1 or the remote potentiometer, this rate being adjustable to adjust and preselect the timing interval. When the timing capacitor charged to $\frac{2}{3}$ of the supply voltage at terminal Vcc, this $\frac{2}{3}$ voltage at threshold terminal A6 causes output terminal A3 to be switched to low. This also causes discharge terminal A7 to be switched to ground by an internal transistor Q14, FIG. 5, to discharge timing capacitor C6, thus to reset the timer circuit.

As a result, D.C. current flows from the gate of Triac Q7 through resistor R13 and diode LED in parallel and then through resistor R12 to the low at terminal A3 to gate the Triac into conduction. This causes A.C. current to flow in the load. Light-emitting diode LED visually indicates that the load is energized.

Protective means are provided for Triac Q7. This means comprises inductor L through which the load current flows, varistor VAR and capacitor C8. Inductor L limits the *di/dt* (rate of change of current) buildup on Triac Q7 turn-on. Varistor VAR performs a double duty in that it not only clip voltage peaks to prevent inadvertent turn-on of the Triac but also, due to its capacitance, changes the LC filter (L, C8) into a "Pi" filter that is more effective in protecting the Triac from being turned on by transients.

A simple visual indicator means is provided to show when the load is energized. This means comprises the LED (light emitting diode) connected across resistor R13 so that it will light up whenever the Triac is gated on. Thus, the single output of comparator module Q6 performs the dual function of driving both the output switch and the indicator light. Failure of this indicator LED will not affect system operation since it is connected in parallel with resistor R13, and this shunt resistor allows current to flow for gating the Triac.

Following closure of the pilot switch and on-delay timing as hereinbefore described, when the pilot switch is reopened, the load is immediately deenergized and the timer circuit is reset for another on-delay operation. This comes about when open pilot switch SW disconnects the 10 volt D.C. supply from the circuit of resistor R4. As a result, current again flows from line L2 through resistors R1, R5, R6 and R4, transistor Q5, and capacitor C3 to line L1. This 120 volt supply causes a voltage rise on resistor R4 on each negative half-cycle large enough to overcome the reverse voltage drop on resistor R3 to bias transistors Q1 and Q3 on for the duration of each negative half-cycle. The action of transistor Q2 switching on and off at a 60 Hz rate is sufficient to continuously trigger comparator module Q6, thus causing output terminal A3 to go high and to remain at high, or off. This terminates gating of Triac Q7 to cause it to turn off at the end of the half-cycle. The action of transistor Q1 turning on each negative half-cycle keeps timing capacitor C6 from accumulating any significant charge until another timing function is deliberately indicated.

The timing operation may be interrupted at any time before the load energizes. This is done by re-opening pilot switch SW before capacitor C6 charges to ⅔ of voltage Vcc. This causes transistors Q1 and Q2 to intermittently turn on and off agan at the 60 Hz rate. As a result, output terminal A3 is maintained at high and never goes low to turn Triac Q7 on, and transistor Q1 discharged any charge on timing capacitor C6 and maintains it discharged.

The system shown in FIG. 1 incorporates a simple and economical leaky switch detector circuit. This leaky switch detector circuit allows proper operation if the closed resistance of pilot switch SW is about 1 kilohm or less or if its open resistance is greater than about 40 kilohms. This provides a substantial safety factor to afford proper operation even if the pilot switch is not perfect or might acquire some resistive film or the like in use.

This leaky switch detector circuit operates as follows. First, it will be recalled from the above description that transistors Q1 and Q2 are normally turned on each negative half-cycle when switch S2 is open and are biased off when pilot switch SW is closed. Since the turn-on current for these transistors flows through resistors R5, R6 and R4 and pilot switch SW is connected from the junction of resistors R5 and R6 to line L1, it will be seen that a simple resistive voltage divider circuit is provided as a leaky switch detector circuit. For a given reverse bias voltage drop in resistor R3 such as 3 volts, a certain current must flow in resistor R4 to provide a voltage drop of opposite polarity exceeding such reverse bias by about 1 volt which is enough to turn transistors Q1 and Q2 on. The value of current in resistor R4 is, of course, dependent on the value of its resistance and that of resistors R5 and R6 in series therewith. And of course, the equivalent value of resistance of resistor R5 is affected by the resistance of switch SW in shunt therewith which also affects the voltage at point Y between resistors R5 and R6. By connecting a variable resistor across open switch SW, it can easily be determined that value of resistance or greater must be present therein to assure turn-on of transistors Q1 and Q2 and also what value of resistance or smaller can be tolerated therein to assure turn-off of these transistors. These value have been selected so that transistors Q1 and Q2 will turn on if the open pilot switch resistance is greater than 40 kilohms and will turn off if the closed pilot switch resistance is 1 kilohm or less.

As shown in FIG. 1, simplicity of this timer system is brought about by referencing all voltages to line L1 and using modular construction. This modular construction uses a transistor array having transistors Q1-Q5 as more clearly shown in FIGS. 2-4, a linear IC comparator module Q6 more clearly shown in FIGS. 5-7, and a Triac Q7 more clearly shown in FIGS. 8-9.

Figure 2:
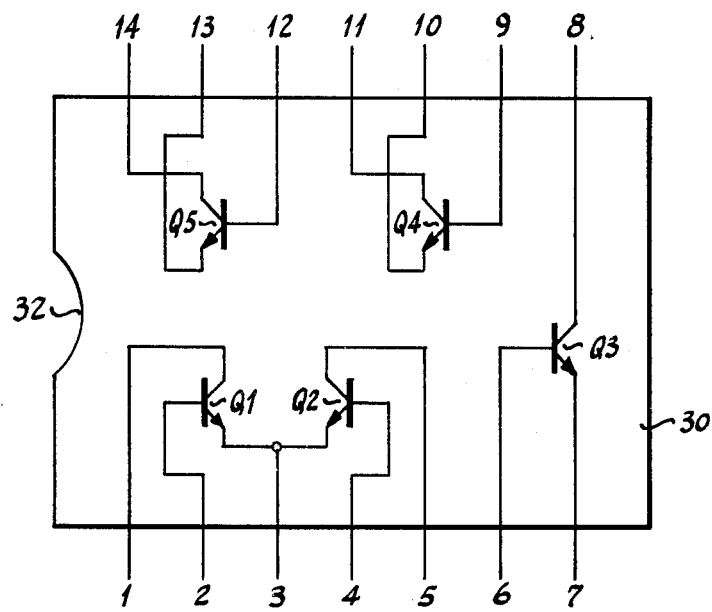
FIG. 2 is a schematic illustration of a dual in-line package (DIP) linear integrated circuit (IC) N-P-N transistor array used in the system of FIG. 1.
Figure 3:
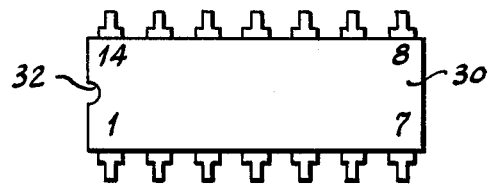
FIGS. 3 and 4 show top and side views of the actual physical construction of the DIP of FIG. 2.
Figure 4:
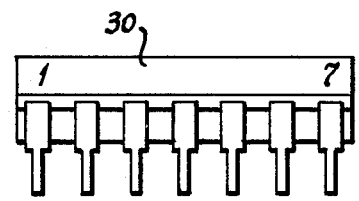

The transistor array, as shown in FIGS. 3 and 4, is constructed in the form of a DIP (dual-in-line-package) having a generally flat, rectangular portion 30 and two rows of terminals 1-7 and 8-14 extending laterally from the respective sides thereof and bent down for entry into holes of a printed circuit board, there being seven terminals numbers 1-7 toward the right in one row along one side and seven terminals numbered 8-14 back toward the left in another row along the other side. A notch 32 at the left end of flat portion 30 indicates orientation. The five transistors are mounted and embedded in this flat rectangular portion and are connected to the fourteen terminals as shown in FIG. 2.

Figure 6:
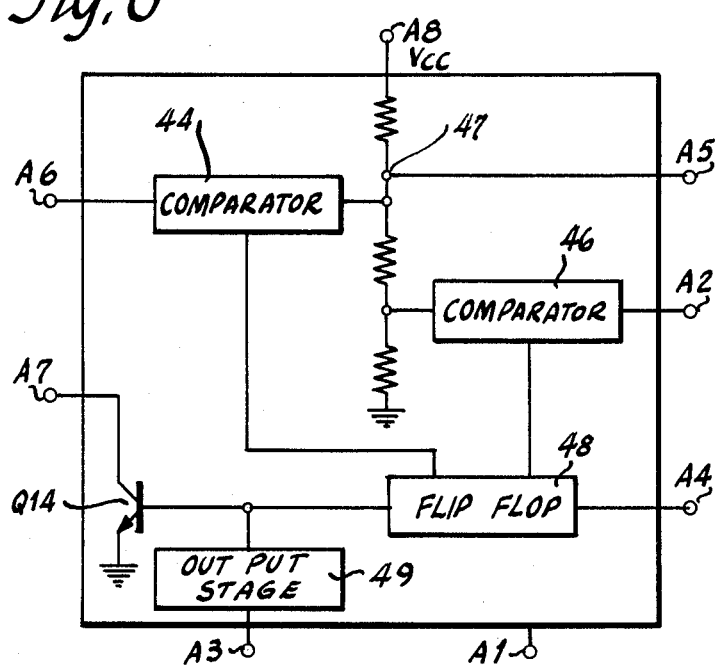
FIG. 6 is a block diagram of the module of FIG. 4.
Figure 7:
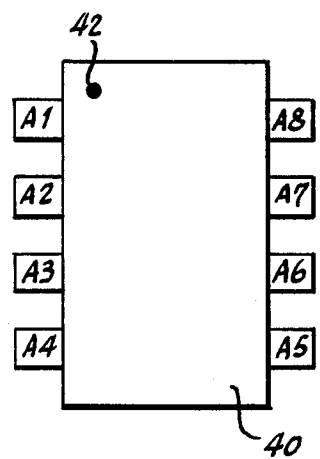
FIG. 7 shows a top view of the actual physical construction of the module of FIGS. 4 and 5.

The linear IC comparator module, also shown in FIGS. 5-7, is constructed in the form of a package having a generally rectangular flat portion 40, shown in FIG. 7, and two rows of terminals along the opposite long sides with four terminals in each row. These terminals are numbered A1-A4 in one direction and A5-A8 back in the other direction. A dot 42 is located at one corner to indicate orientation.

As shown in FIG. 6, this module Q6 comprises primarily two comparators 44 and 46, a voltage divider 47, a flip-flop 48, and output stage 49 and a discharge transistor Q14 which are connected to the eight terminals. The transistor circuit details of this timer are shown in FIG. 5, which is similar to a Signetics Corp. 555 Linear Integrated Circuit Timer.

Figure 8:
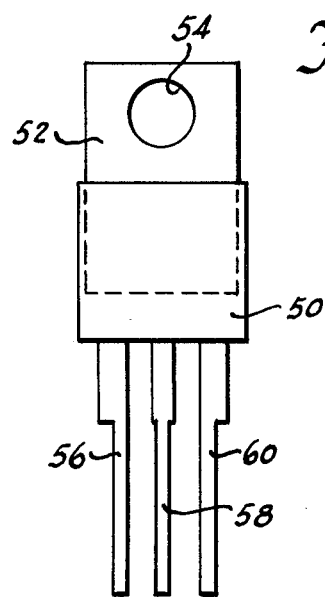
FIGS. 8 and 9 show front and side views of the thyristor used in the timer system of FIG. 1.
Figure 9:
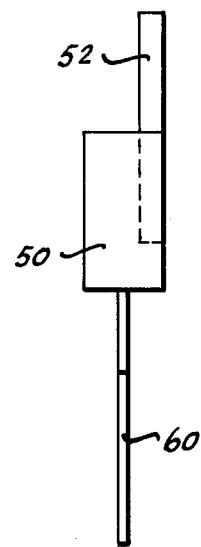

Triac Q7 is shown in FIGS. 8 and 9. This Triac is a sensitive gate thyristor comprising a generally flat rectangular package 50 in which the solid thyristor element is mounted and embedded. This element is mounted on a heat sink 52 having a hole 54 therein for mounting the device so as to conduct heat away therefrom. Three terminals 56, 58 and 60 extend from the end of package 50 opposite the heat sink and are connected therewithin to the T1, T2 and gate G terminals, respectively.

While the apparatus hereinbefore described is effectively adapted to fulfill the objects stated, it is to be understood that the invention is not intended to be confined to the particular preferred embodiment of modular IC on-delay timer disclosed, inasmuch as it is susceptible of various modifications without departing from the scope of the appended claims.

We claim:

1. A solid state on-delay timer comprising:
    an alternating current power source;
    first and second A.C. power supply lines connected to and supplied from said A.C. power source;
    a D.C. power conductor;
    rectifying, D.C. power circuit means connected to and supplied from said first and second A.C. power supply lines for providing a reduced D.C. voltage across said first A.C. power supply line and said D.C. power conductor whereby all voltages are referenced to said first A.C. power supply line as a common supply line;
    a timer circuit supplied with said D.C. voltage across said common supply line and said D.C. power conductor and having an output terminal;
    a timer control circuit supplies across said common supply line and said second A.C. supply line and across said common supply line and said D.C. power conductor and being connected to said timer circuit to control turning of the latter off;
    a pilot switch connected between said common supply line and said timer control circuit to control the latter to turn said timer circuit on so as to provide an output signal after a predetermined time interval;
    a thyristor circuit connected in series with a load device across said common supply line and said second A.C. supply line;
    and control means connecting said output terminal of said timer circuit to said thyristor to control conduction of the latter to energize the load.

2. The solid state on-delay timer defined in claim 1, wherein:
    said timer circuit comprises a multi-transistor integrated circuit triggering device having an external adjustable RC circuit including an adjustable resistor and a capacitor for providing a presettable timing interval.

3. The solid state on-delay timer defined in claim 2, wherein:
    said timer control circuit comprises an integrated circuit plural-transistor array in a dual-in-line-package.

4. The solid state on-delay timer defined in claim 3, wheren said timer circuit also comprises a pair of supply terminals across which said D.C. voltage is connected, a trigger terminal and means responsive to a low thereat for providing a high at said output terminal and being responsive to a high at said trigger terminal for conditioning the same for providing an output low, and a threshold terminal and means responsive to increase of an input signal voltage thereat to a predetermined proportion of said D.C. voltage for switching said output terminal from high to low as an output signal; and said timer control circuit comprises:
    a first transistor of said array connected for shunting said timing capacitor;
    a second transistor of said array connected to said D.C. power conductor for applying a low to said trigger terminal,
    and means for reverse-biasing said first and second transistors to keep them turned off in the absence of a turn-on signal.

5. The solid state on-delay timer defined in claim 4, wherein:
    said timer control circuit also comprises a voltage divider circuit having a plurality of resistors and a third transistor of said array connected in series across said common supply line and said second A.C. power supply line with said third transistor connected to rectify the negative half-cycle of the A.C. current in said voltage divider circuit;
    one of said resistors being connected to provide a voltage drop in response to said rectified current to overcome said reverse-bias and turn on said first and second transistors thereby to shunt said timing capacitor and to provide a low to said trigger terminal to keep said timer circuit off;
    and said pilot switch being effective when closed to connect a portion of said voltage divider circuit including said one resistor across said common supply line and said other A.C. power supply line thereby to substitute the current from said reduced D.C. voltage in place of said rectified current in said one resistor and thus alowing said first and second transistors to be turned off by said reversing-biasing means.

6. The solid state on-delay timer defined in claim 5, wherein:
    said plurality of resistors of said voltage divider circuit include second and third resistors providing in conjunction with said first resistor a leaky switch detector circuit;
    said second resistor being connected between said pilot switch and said second A.C. power supply line;
    said third resistor being connected in series with said first resistor and said third transistor;
    and said resistors having a combination of resistance values relative to the voltages of the circuit to afford proper operation if the closed pilot switch resistance is one kilohm or less and if the open pilot switch resistance is forty kilohms or more.

7. The solid state on-delay timer defined in claim 4, wherein said rectifying, D.C. power circuit means comprises:
    a voltage regulating circuit for regulating said D.C. voltage comprising:
    a solid state voltage control device connected across said common supply line and said D.C. power conductor;
    and a current limiting resistor in series with said solid state voltage control device for controlling the current in the latter and serving also as said reverse-biasing means for said first and second transistors.

8. The solid state on-delay timer defined in claim 5, wherein:
    said solid state voltage control device is a fourth transistor of said array connected as a zener diode.

9. The solid state on-delay timer defined in claim 8, wherein said voltage divider circuit comprises:

another transistor of said array connected from said D.C. power conductor as a reverse diode across said one resistor, said third transistor and said current limiting resistor to limit the reverse voltage on said first and second transistors.

10. The solid state on-delay timer defined in claim 8, wherein said voltage divider circuit comprises:
another transistor of said array connected as a zener diode across said one resistor and said third transistor and to said D.C. power conductor to limit the maximum voltage applicable to said first and second transistors.

11. The solid state on-delay timer defined in claim 5, wherein said voltage divider circuit comprises:
a delay capacitor connected across said one resistor and said third transistor operable to charge whenever said pilot switch is open and operable to discharge to afford a delay in initiation of timing whenever said pilot switch is closed thereby to prevent any mechanical contact bounce from causing erratic operation.

12. The solid state on-delay timer defined in claim 5, wherein said timer control circuit also comprises:
a capacitor connected across said second transistor and being operable to discharge on each said negative half-cycle when said second transistor is turned on and being operable to charge at the beginning of alternate periods when said second transistor is turned off thereby to lengthen the periods during which a low is applied to said trigger terminal.

13. The solid state on-delay timer defined in claim 1, wherein said thyristor circuit comprises:
a gate-controlled bidirectional thyristor and a protective circuit therefor including:
an inductor in series with said thyristor and the load device;
a varistor connected across said thyristor;
and a capacitor connected across said thyristor and said inductor to provide with said inductor an LC filter;
whereby the inductance limits the rate of change of current in said thyristor during turn-on thereof and the varistor clips voltage peaks and also due to its capacitance modifies said LC filter into a "Pi" filter that is more effective in suppressing transient voltages.

14. The solid state on-delay timer defined in claim 1, wherein said control means comprises:
a gate resistor connected between said output terminal and said thyristor to control the gating current of the latter;
and an indicator connected across said gate resistor operable to indicate the energized condition of the load.

15. The solid state on-delay timer defined in claim 14, wherein:
said indicator is a light emitting diode.

* * * * *